(12) United States Patent
Han

(10) Patent No.: US 11,658,645 B2
(45) Date of Patent: *May 23, 2023

(54) DUTY CORRECTION DEVICE AND METHOD, AND SEMICONDUCTOR APPARATUS USING THE SAME

(71) Applicant: SK hynix Inc., Icheon-si Gyeonggi-do (KR)

(72) Inventor: Hyun Wook Han, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/856,469

(22) Filed: Jul. 1, 2022

(65) Prior Publication Data

US 2022/0337228 A1    Oct. 20, 2022

Related U.S. Application Data

(63) Continuation of application No. 17/174,028, filed on Feb. 11, 2021, now Pat. No. 11,424,735.

(30) Foreign Application Priority Data

Oct. 7, 2020    (KR) .......................... 10-2020-0129134

(51) Int. Cl.
*H03K 3/017* (2006.01)
*H03L 7/081* (2006.01)
*G06F 1/10* (2006.01)
*H03K 5/01* (2006.01)
*G06F 1/06* (2006.01)
*H03K 5/00* (2006.01)

(52) U.S. Cl.
CPC ............... *H03K 3/017* (2013.01); *G06F 1/06* (2013.01); *G06F 1/10* (2013.01); *H03K 5/00006* (2013.01); *H03K 5/01* (2013.01); *H03L 7/0812* (2013.01)

(58) Field of Classification Search
CPC ...... H03K 3/017; H03K 5/00006; H03K 5/01; G06F 1/06; G06F 1/10; H03L 7/0812
See application file for complete search history.

(56) References Cited

U.S. PATENT DOCUMENTS

| | | | |
|---|---|---|---|
| 7,120,839 B2 | 10/2006 | Fayneh et al. | |
| 7,825,711 B2 | 11/2010 | Ma | |
| 8,508,272 B2 | 8/2013 | Chung | |
| 10,284,182 B2 | 5/2019 | Modi et al. | |
| 11,070,200 B2 | 7/2021 | Martin et al. | |
| 11,121,706 B1 | 9/2021 | Kim et al. | |
| 11,424,735 B2* | 8/2022 | Han | H03K 5/01 |

(Continued)

FOREIGN PATENT DOCUMENTS

KR    101019985 B1    3/2011

*Primary Examiner* — Cassandra F Cox
(74) *Attorney, Agent, or Firm* — William Park & Associates Ltd.

(57) ABSTRACT

A duty correction device includes a global duty correction circuit and a local duty correction circuit. The global duty correction circuit performs a global duty correction operation on a first clock signal and a second clock signal based on a local correction signal. The local duty correction circuit performs a local duty correction by detecting phases of the first and second clock signals, and enables the local correction signal when a number of the local duty correction operation reaches a threshold value.

13 Claims, 10 Drawing Sheets

(56) References Cited

U.S. PATENT DOCUMENTS

| | | |
|---|---|---|
| 2015/0097603 A1 | 4/2015 | Amirkhany et al. |
| 2016/0241249 A1 | 8/2016 | Balamurugan et al. |
| 2022/0052678 A1 | 2/2022 | Choi et al. |

* cited by examiner

DUTY CORRECTION DEVICE AND METHOD, AND SEMICONDUCTOR APPARATUS USING THE SAME

CROSS-REFERENCES TO RELATED APPLICATION

The present application is a continuation application of U.S. patent application Ser. No. 17/174,028, filed on Feb. 11, 2021, and claims priority under 35 U.S.C. § 119(a) to Korean application number 10-2020-0129134, filed on Oct. 7, 2020, in the Korean Intellectual Property Office, which is incorporated herein by reference in its entirety.

BACKGROUND

1. Technical Field

Various embodiments generally relate to an integrated circuit technology, and more particularly, to a duty correction device and method and a semiconductor apparatus using the same.

2. Related Art

An electronic device may include a large number of electronic components. Among the electronic components, a computer system may include many semiconductor apparatuses composed of semiconductors. The semiconductor apparatuses constituting the computer system may communicate with each other while transmitting and receiving a clock signal and data. Each of the semiconductor apparatuses may transmit data to another semiconductor apparatus in synchronization with the clock signal, or receive data transmitted from another semiconductor apparatus in synchronization with the clock signal. The semiconductor apparatuses synchronize the timings of the clock signal and the data through internal circuits. However, the phases of the clock signal and the data may be distorted depending on skews and process variations of transistors. When the phases of the clock signal and the data are distorted, the valid window or duration of the data may be reduced to make it difficult for the semiconductor apparatuses to accurately perform data communication. Therefore, the semiconductor apparatuses each include a duty correction circuit for compensating for a phase skew between the data and the clock signal.

SUMMARY

In an embodiment, a duty correction device may include a global duty correction circuit and a local duty correction circuit. The global duty correction circuit may be configured to perform a global duty correction operation of outputting at least a first clock signal and a second clock signal based on an internal clock signal and adjusting output timing of at least one of the first and second clock signals based on a local correction signal. The local duty correction circuit may be configured to perform a local duty correction operation of detecting phases of the first and second clock signals and variably delaying one or more of a first aligned signal and a second aligned signal which are synchronized with the first and second clock signals, respectively, and generate the local correction signal by counting a number of times that the local duty correction operation is performed.

In an embodiment, a duty correction method may include performing, by a local duty correction circuit, a local duty correction operation of detecting phases of a first clock signal and a second clock signal, and variably delaying a first aligned signal and a second aligned signal, which are synchronized with the first and second clock signals, respectively. The duty correction method may include providing, by the local duty correction circuit, a local correction signal to a global duty correction circuit when a number of times that the local duty correction operation is performed reaches a threshold value. The correction method may include performing, by the global duty correction circuit, a global duty correction operation on the first and second clock signals based on the local correction signal.

In an embodiment, a semiconductor apparatus may include a clock generation circuit, a clock distribution network, a first output circuit, and a second output circuit. The clock generation circuit may be configured to generate a delayed clock signal by performing a delay locking operation on a reference clock signal. The clock distribution network may be configured to generate at least a first clock signal and a second clock signal based on the delayed clock signal, and adjust output timing of at least one of the first and second clock signals based on at least a first local correction signal and a second local correction signal. The first output circuit may be configured to generate a plurality of first aligned signals by synchronizing a plurality of first data signals with the first and second clock signals, variably delaying one or more of the plurality of first aligned signals by detecting phases of the first and second clock signals, and generate the first local correction signal by counting a number of times that at least one of the plurality of first aligned signals is variably delayed. The second output circuit may be configured to generate a plurality of second aligned signals by synchronizing a plurality of second data signals with the first and second clock signals, variably delaying one or more of the plurality of second aligned signals by detecting the phases of the first and second clock signals, and generating the second local correction signal by counting a number of times that at least one of the plurality of second aligned signals is variably delayed.

In an embodiment, a semiconductor apparatus may include a global duty correction circuit and a plurality of local duty correction circuits. The global duty correction circuit may be configured to generate a first clock signal and a second clock signal based on an internal clock signal, and perform a global duty correction operation on the first and second clock signals when the majority of a plurality of local correction signals related to the first and second clock signals is enabled. The plurality of local duty correction circuits may be configured to output a plurality of output data, respectively, in synchronization with the first and second clock signals, detect phases of the first and second clock signals to adjust the points in time that the plurality of output data are outputted, respectively, and enable each of the local correction signals when a number of times that the output timing of the corresponding output data is adjusted reaches a threshold value.

DETAILED DESCRIPTION

Figure 1:
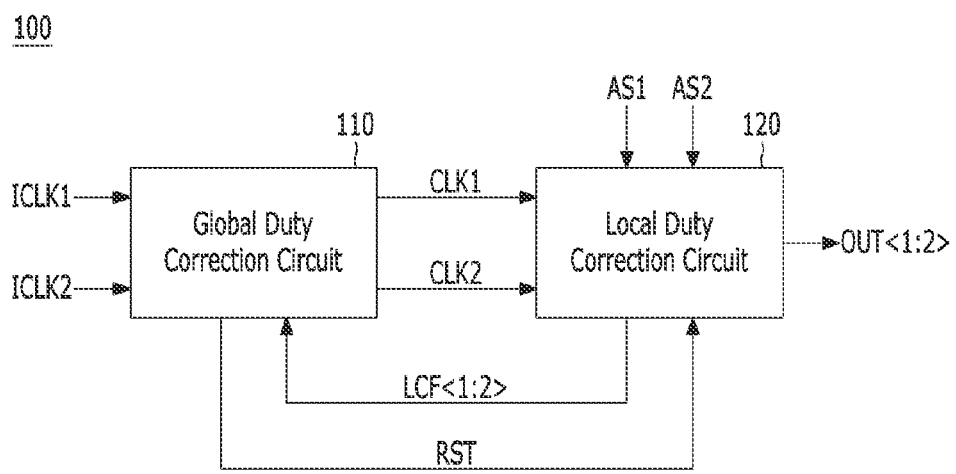
FIG. 1 is a block diagram illustrating a configuration of a duty correction device in accordance with an embodiment.

FIG. 1 is a block diagram illustrating a configuration of a duty correction device 100 in accordance with an embodiment. Referring to FIG. 1, the duty correction device 100 may perform a duty correction operation of compensating for a change in phase and/or duty ratio of a clock signal. The duty correction device 100 may include a global duty correction circuit 110 and a local duty correction circuit 120. The global duty correction circuit 110 may perform a global duty correction operation, and the local duty correction circuit 120 may perform a local duty correction operation. The duty correction device 100 may preferentially perform the local duty correction operation through the local duty correction circuit 120. When the number of the local duty location operations reaches a threshold value, the duty correction device 100 may perform the global duty correction operation through the global duty correction circuit 110. When the global duty correction operation is performed, the local duty correction circuit 120 may reset information related to the local duty correction operation.

The global duty correction circuit 110 may receive an internal clock signal, and output at least a first clock signal CLK1 and a second clock signal CLK2. The internal clock signal may include a first internal clock signal ICLK1 and a second internal clock signal ICLK2. FIG. 1 illustrates that two internal clock signals are inputted to the global duty correction circuit 110, and two clock signals are outputted from the global duty correction circuit 110. However, the numbers of the internal clock signals and the clock signals are not limited thereto, but may each be one or three or more. The first and second internal clock signals ICLK1 and ICLK2 may have a unit phase difference therebetween. The unit phase difference may correspond to ¼ period of the first or second internal clock signal ICLK1 or ICLK2. The first and second clock signals CLK1 and CLK2 may also have a unit phase difference therebetween. The unit phase difference may correspond to ¼ period of the first or second clock signal CLK1 or CLK2. The global duty correction circuit 110 may receive a local correction signal LCF<1:2> from the local duty correction circuit 120. The local correction signal LCF<1:2> may include duty correction information on the first clock signal CLK1 and duty correction information on the second clock signal CLK2. For example, a first bit LCF<1> of the local correction signal may correspond to the duty correction information on the first clock signal CLK1, and a second bit LCF>2> of the local correction signal may correspond to the duty correction information on the second clock signal CLK2. The global duty correction circuit 110 may adjust the output timing of at least one of the first and second clock signals CLK1 and CLK2 based on the local correction signal LCF<1:2>. The global duty correction circuit 110 may perform the global duty correction operation by variably delaying one or more of the first and second internal clock signals ICLK1 and ICLK2 in order to adjust the output timings of the first and second clock signals CLK1 and CLK2. The global duty correction circuit 110 may generate a reset signal RST after performing the global duty correction operation.

The local duty correction circuit 120 may receive the first and second clock signals CLK1 and CLK2 from the global duty correction circuit 110, and may receive a first aligned signal AS1 and a second aligned signal AS2. The first aligned signal AS1 may be a signal synchronized with the first clock signal CLK1, and the second aligned signal AS2 may be a signal synchronized with the second clock signal CLK2. The local duty correction circuit 120 may perform the local duty correction operation by detecting the phases of the first and second clock signals CLK1 and CLK2 and variably delaying one or more of the first and second aligned signals AS1 and AS2. The local duty correction circuit 120 may generate an output signal OUT<1:2> by variably delaying one or more of the first and second aligned signals AS1 and AS2. The first and second aligned signals AS1 and AS2 may be sequentially outputted as the output signal OUT<1:2>.

The local duty correction circuit 120 may generate the local correction signal LCF<1:2> by counting the number of times that the local duty correction operation has been performed. The number of times that the local duty correction operation has been performed may correspond to the number of times that at least one of the first and second aligned signals AS1 and AS2 is variably delayed. The local duty correction circuit 120 may enable the local correction signal LCF<1:2> when the number of times that the local duty correction operation has been performed reaches the threshold value. The local duty correction circuit 120 may independently count the number of times that the local duty correction operation has been performed on the first aligned signal AS1 and the number of times that the local duty correction operation has been performed on the second aligned signal AS2. The local duty correction circuit 120 may change the first bit LCF<1> of the local correction signal to a high logic level when the number of times that the local duty correction operation has been performed on the first aligned signal AS1 reaches the threshold value. The local duty correction circuit 120 may change the second bit LCF<2> of the local correction signal to a high logic level when the number of times that the local duty correction operation has been performed on the second aligned signal AS2 reaches the threshold value. It will be described that the local duty correction circuit 120 may generate a phase correction signal by comparing the phases of the first and second clock signals CLK1 and CLK2, and generate the local correction signal LCF<1:2> by counting the number of times that the phase correction signal is generated.

The local duty correction circuit 120 may receive the reset signal RST from the global duty correction circuit 110. The local duty correction circuit 120 may reset the local correction signal LCF<1:2> based on the reset signal RST. For example, the local duty correction circuit 120 may reset the first and second bits LCF<1:2> of the local correction signal to a low logic level.

Figure 2:
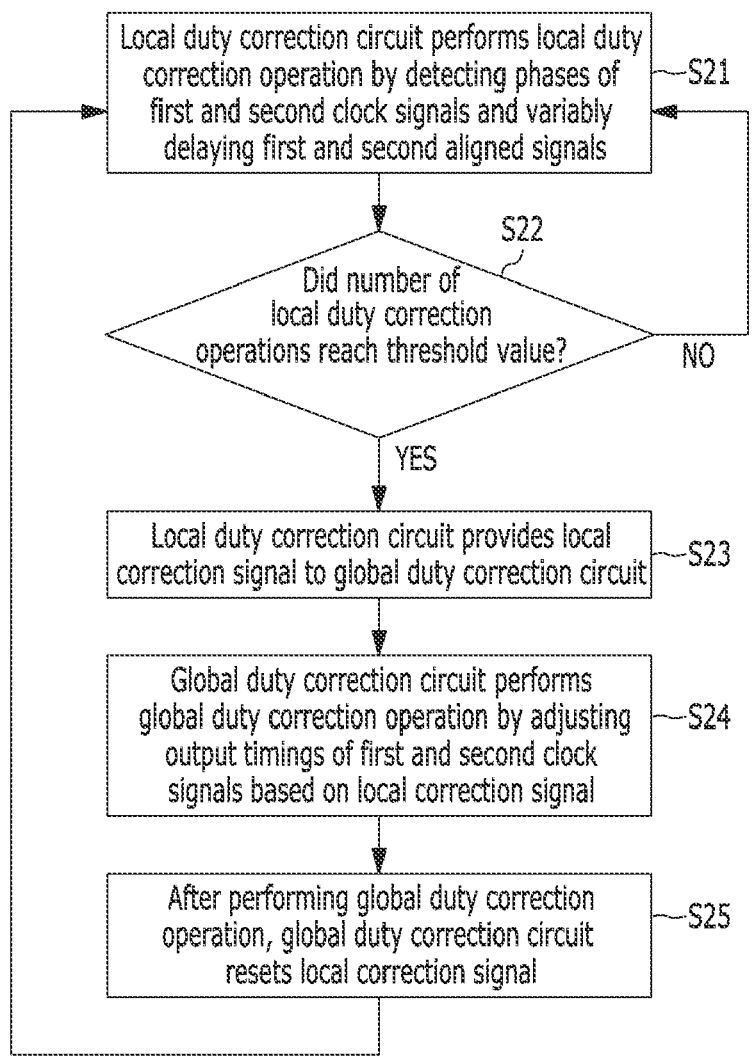
FIG. 2 is a flowchart illustrating an operation of the duty correction device in accordance with an embodiment.

FIG. 2 is a flowchart illustrating an operation of the duty correction device in accordance with the present embodiment. Referring to FIGS. 1 and 2, the global duty correction circuit 110 may not perform the global duty correction operation before the local correction signal LCF<1:2> is enabled, but may output the first internal clock signal ICLK1 as the first clock signal CLK1 and may output the second internal clock signal ICLK2 as the second clock signal CLK2. For example, the global duty correction circuit 110 may generate the first and second clock signals CLK1 and CLK2 by delaying the first and second internal clock signals ICLK1 and ICLK2 by the same amount of time. The global duty correction circuit 110 may generate the first and second clock signals CLK1 and CLK2 by delaying the first and second internal clock signals ICLK1 and ICLK2 by a reference time. In step S21, the local duty correction circuit 120 may detect the phases and/or duty ratios of the first and second clock signals CLK1 and CLK2. The local duty correction circuit 120 may sense a phase difference between the first and second clock signals CLK1 and CLK2 by comparing the duty ratios of the first and second clock signals CLK1 and CLK2. The local duty correction circuit 120 may variably delay the first and second aligned signals AS1 and AS2 according to the phase detection result. Ideally, the first and second clock signals CLK1 and CLK2 may each have a duty ratio of 50:50. The duty ratio of 50:50 may indicate that a high level interval of the clock signal is equal to a low level interval thereof. For example, when the duty ratio of the second clock signal CLK2 is 60:40, it may indicate that a phase difference between the first clock signal CLK1 and the second clock signal CLK2 becomes smaller than the unit phase difference, and the phase of the second clock signal CLK2 may be advanced. Furthermore, a phase difference between the first aligned signal AS1 synchronized with the first clock signal CLK1 and the second aligned signal AS2 synchronized with the second clock signal CLK2 may become smaller than the unit phase difference. The local duty correction circuit 120 may increase the time by which the second aligned signal AS2 synchronized with the second clock signal CLK2 is delayed, in accordance with the phase detection result. Therefore, the duration of the output signal OUT<1:2> outputted from the local duty correction circuit 120 may become constant. That is, the duration of the output signal OUT<1> corresponding to the first aligned signal AS1 may become substantially equal to the duration of the output signal OUT<2> corresponding to the second aligned signal AS2.

In step S22, the local duty correction circuit 120 may determine whether the number of times that the local duty correction operation has been performed has reached the threshold value. For example, the local duty correction circuit 120 may determine whether the number of the local duty correction operations reached the threshold value, depending on whether the same phase detection result has been generated by the number of times corresponding to the threshold value. The local duty correction circuit 120 may enable the local correction signal LCF<1:2> by counting the number of times that the same phase detection result has been generated. When the number of times that the local duty correction operation has been performed does not reach the threshold value, the local duty correction circuit 120 may return to step S21 to perform the local duty correction operation. When the number of times that the local duty correction operation has been performed reaches the threshold value, the local duty correction circuit 120 may provide the local correction signal LCF<1:2> to the global duty correction circuit 110 in step S23.

In step S24, the global duty correction circuit 110 may perform the global duty correction operation based on the local correction signal LCF<1:2>. The global duty correction circuit 110 may change the output timing of at least one of the first and second clock signals CLK1 and CLK2 based on the local correction signal LCF<1:2>. For example, when the first bit LCF<1> of the local correction signal is at a low logic level and the second bit LCF<2> of the local correction signal is at a high logic level, the global duty correction circuit 110 may delay the first clock signal CLK1 by the reference time, and increase the delay time of the second clock signal CLK2. Since the second bit LCF<2> of the local correction signal transitions to a high logic level when it is detected that the number of times that the phase of the second clock signal CLK2 is advanced is equal to or more than a threshold value, the global duty correction circuit 110 may increase the time by which the second internal clock signal ICLK2 is delayed, thereby delaying the point in time that the second clock signal CLK2 is outputted. The global duty correction circuit 110 may perform the duty correction operation such that the first and second clock signals CLK1 and CLK2 have a unit phase difference therebetween.

In step S25, the global duty correction circuit 110 may generate the reset signal RST after performing the global duty correction operation. The local duty correction circuit 120 may reset the local correction signal LCF<1:2> based on the reset signal RST. After the local correction signal CLF<1:2> is reset, the procedure may return to S21, and the local duty correction circuit 120 may redetect the phases of the first and second clock signals CLK1 and CLK2 in order to perform the local duty correction operation.

Figure 3:
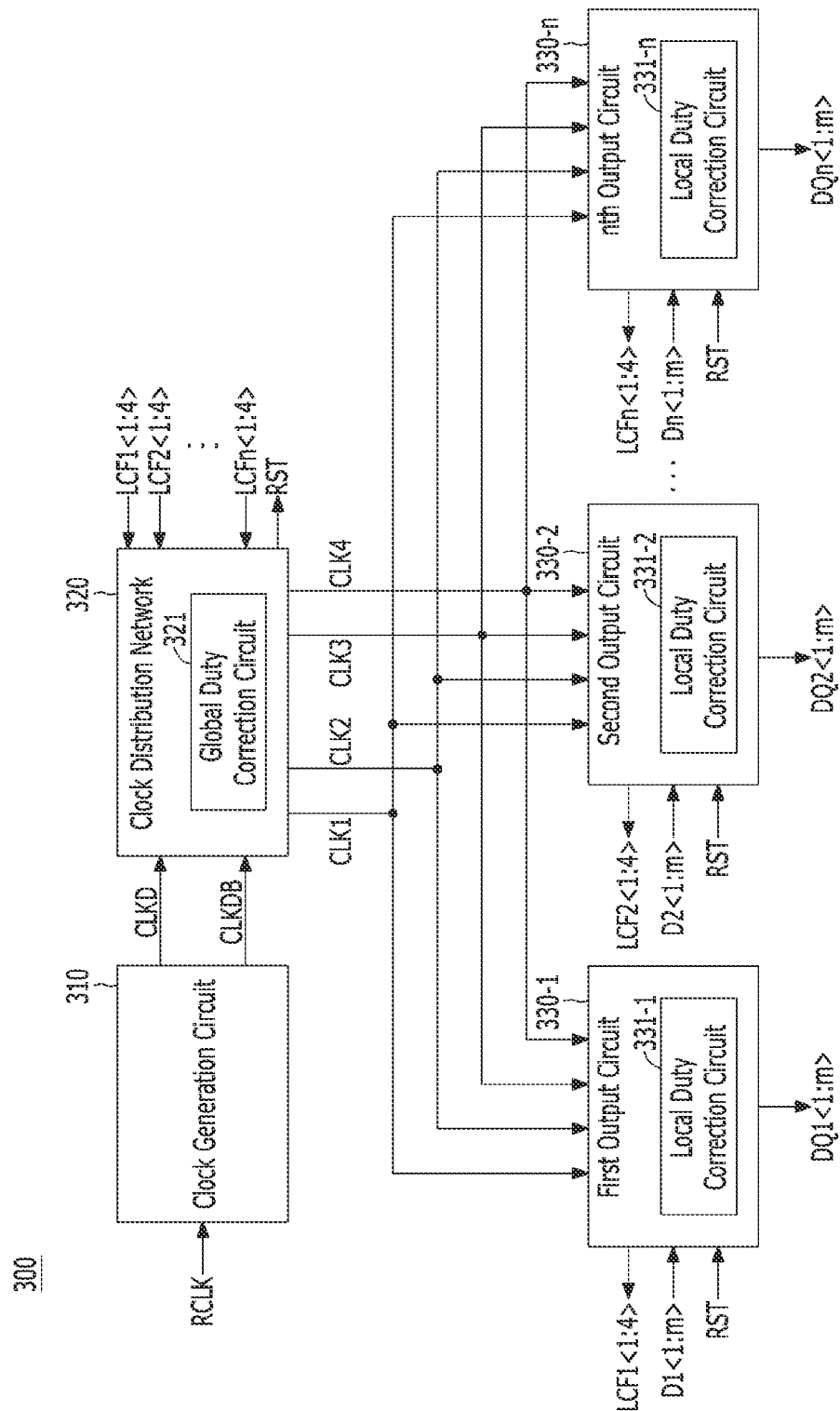
FIG. 3 is a block diagram illustrating a configuration of a semiconductor apparatus in accordance with an embodiment.

FIG. 3 is a block diagram illustrating a configuration of a semiconductor apparatus 300 in accordance with an embodiment. Referring to FIG. 3, the semiconductor apparatus 300 may include a clock generation circuit 310, a clock distribution network 320 and a plurality of output circuits 330-1 to 330-$n$ where n is an integer equal to or more than 3. The clock generation circuit 310 may receive a reference clock signal RCLK and generate a delayed clock signal CLKD. The clock generation circuit 310 may generate the delayed clock signal CLKD and a complementary signal CLKDB. The complementary signal CLKDB and the delayed clock signal CLKD may be exactly out of phase. The clock generation circuit 310 may generate the delayed clock signal CLKD and the complementary signal CLKDB by performing a delay locking operation on the reference clock signal RCLK. The clock generation circuit 310 may include any publicly known delay locked loop circuits capable of performing a delay locking operation.

The clock distribution network 320 may receive the delayed clock signal CLKD, and output a plurality of clock signals. The clock distribution network 320 may transmit the plurality of clock signals to the plurality of output circuits 330-1 to 330-$n$. The clock distribution network 320 may generate a plurality of divided clock signals by dividing the frequency of the delayed clock signal CLKD, delay the plurality of divided clock signals, and output the delayed clock signals as the plurality of clock signals. The number of the clock signals may be two or more. FIG. 3 illustrates four clock signals. However, the number of the clock signals may be lower or higher than four. The clock distribution network 320 may transmit a first clock signal CLK1, a second clock signal CLK2, a third clock signal CLK3 and a fourth clock signal CLK4 to the plurality of output circuits 330-1 to 330-$n$. The clock distribution network 320 may variably delay one or more of the first to fourth clock signals CLK1 to CLK4 based on first to $n^{th}$ local correction signals LCF1<1:4> to LCFn<1:4> provided from the plurality of output circuits.

The clock distribution network 320 may include a global duty correction circuit 321. The global duty correction circuit 321 may perform the global duty correction operation by adjusting the point in time that at least one of the first to fourth clock signals CLK1 to CLK4 is outputted, based on the first to $n^{th}$ local correction signals LCF1<1:4> to LCFn<1:4>. The global duty correction circuit 321 may adjust the point in time that the first clock signal CLK1 is outputted, based on a local correction signal related to the first clock signal CLK1 among the first to $n^{th}$ local correction signals LCF1<1:4> to LCFn<1:4>. The global duty correction circuit 321 may change the point in time that the first clock signal CLK1 is outputted, when the majority of the local correction signals related to the first clock signal CLK1 among the first to $n^{th}$ local correction signals LCF1<1:4> to LCFn<1:4> is enabled. For example, the first bits LCF1<1> to LCFn<1> of the first to $n^{th}$ local correction signals may include duty correction information related to the first clock signal CLK1. The global duty correction circuit 321 may change the point in time that the first clock signal CLK1 is outputted, when the majority of the first bits LCF1<1> to LCFn<1> of the first to $n^{th}$ local correction signals has a high logic level.

The global duty correction circuit 321 may adjust the point in time that the second clock signal CLK2 is outputted, based on local correction signals related to the second clock signal CLK2 among the first to $n^{th}$ local correction signals LCF1<1:4> to LCFn<1:4>. The global duty correction circuit 321 may change the point in time that the second clock signal CLK2 is outputted, when the majority of the local correction signals related to the second clock signal CLK2 among the first to $n^{th}$ local correction signals LCF1<1:4> to LCFn<1:4> is enabled. For example, the second bits LCF1<2> to LCFn<2> of the first to $n^{th}$ local correction signals may include duty correction information related to the second clock signal CLK2. The global duty correction circuit 321 may change the point in time that the second clock signal CLK2 is outputted, when the majority of the second bits LCF1<2> to LCFn<2> of the first to $n^{th}$ local correction signals has a high logic level.

The global duty correction circuit 321 may adjust the point in time that the third clock signal CLK3 is outputted, based on local correction signals related to the third clock signal CLK3 among the first to $n^{th}$ local correction signals LCF1<1:4> to LCFn<1:4>. The global duty correction circuit 321 may change the point in time that the third clock signal CLK3 is outputted, when the majority of the local correction signals related to the third clock signal CLK3 among the first to $n^{th}$ local correction signals LCF1<1:4> to LCFn<1:4> is enabled. For example, the third bits LCF1<3> to LCFn<3> of the first to $n^{th}$ local correction signals may include duty correction information related to the third clock signal CLK3. The global duty correction circuit 321 may change the point in time that the third clock signal CLK3 is outputted, when the majority of the third bits LCF1<3> to LCFn<3> of the first to $n^{th}$ local correction signals has a high logic level.

The global duty correction circuit 321 may adjust the point in time that the fourth clock signal CLK4 is outputted, based on local correction signals related to the fourth clock signal CLK4 among the first to $n^{th}$ local correction signals LCF1<1:4> to LCFn<1:4>. The global duty correction circuit 321 may change the point in time that the fourth clock signal CLK4 is outputted, when the majority of the local correction signals related to the fourth clock signal CLK4 among the first to $n^{th}$ local correction signals LCF1<1:4> to LCFn<1:4> is enabled. For example, the fourth bits LCF1<4> to LCFn<4> of the first to $n^{th}$ local correction signals may include duty correction information related to the fourth clock signal CLK4. The global duty correction circuit 321 may change the point in time that the fourth clock signal CLK4 is outputted, when the majority of the fourth bits LCF1<4> to LCFn<4> of the first to $n^{th}$ local correction signals has a high logic level.

The global duty correction circuit 321 may generate the reset signal RST after adjusting the point of times that the first to fourth clock signals CLK1 to CLK4 are outputted, based on the first to $n^{th}$ local correction signals LCF1<1:4> to LCFn<1:4>. As will be described below, the reset signal RST may be provided to local duty correction circuits 331-1 to 331-n included in the plurality of output circuits 330-1 to 330-n.

The plurality of output circuits 330-1 to 330-n may be data output circuits to output data. In FIG. 2, the plurality of output circuits may include a first output circuit 330-1, a second output circuit 330-2, . . . , and an $n^{th}$ output circuit 330-n. The first output circuit 330-1 may receive a plurality of first data signals D1<1:m> and the first to fourth clock signals CLK1 to CLK4, and generate first output data DQ1<1m>. The number of the first data signals D1<1:m> may be set to m, where m is an integer equal to or more than 2. The first output circuit 330-1 may generate a plurality of first aligned data signals by sequentially synchronizing the plurality of first data signals D1<1:m> with the first to fourth clock signals CLK1 to CLK4. The first output circuit 330-1 may detect the phases of the first to fourth clock signals CLK1 to CLK4, and adjust the timing at which the first output data DQ1<1:m> is outputted. The first output circuit 330-1 may generate the first local correction signal LCF1<1:4> based on the number of times that the output timing of the first output data DQ1<1:m> is adjusted.

The second output circuit 330-2 may receive a plurality of second data signals D2<1:m> and the first to fourth clock signals CLK1 to CLK4, and may generate second output data DQ2<1:m>. The second output circuit 330-2 may generate a plurality of second aligned data signals by sequentially synchronizing the plurality of second data signals D2<1:m> with the first to fourth clock signals CLK1 to CLK4. The second output circuit 330-2 may detect the phases of the first to fourth clock signals CLK1 to CLK4, and adjust the timing at which the second output data DQ2<1:m> is outputted. The second output circuit 330-2 may generate the second local correction signal LCF2<1:4> based on the number of times that the output timing of the second output data DQ2<1:m> is adjusted.

The $n^{th}$ output circuit 330-n may receive a plurality of $n^{th}$ data signals Dn<1:m> and the first to fourth clock signals CLK1 to CLK4, and may generate n-th output data DQn<1:m>. The $n^{th}$ output circuit 330-n may generate a plurality of $n^{th}$ aligned data signals by sequentially synchronizing the plurality of $n^{th}$ data signals Dn<1:m> with the first to fourth clock signals CLK1 to CLK4. The $n^{th}$ output circuit 330-n may detect the phases of the first to fourth clock signals CLK1 to CLK4, and may adjust the timing at which the $n^{th}$ output data DQn<1:m> is outputted. The $n^{th}$ output circuit 330-n may generate the $n^{th}$ local correction signal LCFn<1:4> based on the number of times that the output timing of the $n^{th}$ output data DQn<1:m> is adjusted.

The first to $n^{th}$ output circuits 330-1 to 330-n may include the local duty correction circuits 331-1 to 331-n, respectively. The local duty correction circuit 331-1 included in the first output circuit 330-1 may detect the phases of the first to fourth clock signals CLK1 to CLK4 and may adjust the timing at which the first output data DQ1<1:m> is outputted, and may generate the first local correction signal LCF<1:4> by counting the number of times that the output timing of the first output data DQ1<1:m> is adjusted. When it is detected that the output timing of the first output data DQ1<1:m> has been adjusted by the number of times corresponding to the threshold value, the local duty correction circuit 331-1 may change a specific bit of the first local correction signal LCF<1:4> to a high logic level. The local duty correction circuit 331-1 may receive the reset signal RST from the global duty correction circuit 321. The local duty correction circuit 331-1 may reset the first local correction signal LCF<1:4> based on the reset signal RST.

The local duty correction circuit 331-2 included in the second output circuit 330-2 may detect the phases of the first to fourth clock signals CLK1 to CLK4 and may adjust the timing at which the second output data DQ2<1:m> is outputted, and may generate the second local correction signal LCF2<1:4> by counting the number of times that the output timing of the second output data DQ2<1:m> has been adjusted. When it is detected that the output timing of the second output data DQ2<1:m> has been adjusted by the number of times corresponding to the threshold value, the local duty correction circuit 331-2 may change a specific bit of the second local correction signal LCF<1:4> to a high logic level. The local duty correction circuit 331-2 may receive the reset signal RST from the global duty correction circuit 321. The local duty correction circuit 331-2 may reset the second local correction signal LCF<1:4> based on the reset signal RST.

The local duty correction circuit 331-$n$ included in the $n^{th}$ output circuit 330-$n$ may detect the phases of the first to fourth clock signals CLK1 to CLK4 and may adjust the timing at which the $n^{th}$ output data DQn<1:m> is outputted, and may generate the $n^{th}$ local correction signal LCFn<1:4> by counting the number of times that the output timing of the $n^{th}$ output data DQn<1:m> has been adjusted. When it is detected that the output timing of the $n^{th}$ output data DQn<1:m> has been adjusted by the number of times corresponding to the threshold value, the local duty correction circuit 331-$n$ may change a specific bit of the $n^{th}$ local correction signal LCFn<1:4> to a high logic level. The local duty correction circuit 331-$n$ may receive the reset signal RST from the global duty correction circuit 321. The local duty correction circuit 331-$n$ may reset the $n^{th}$ local correction signal LCFn<1:4> based on the reset signal RST.

Figure 4:
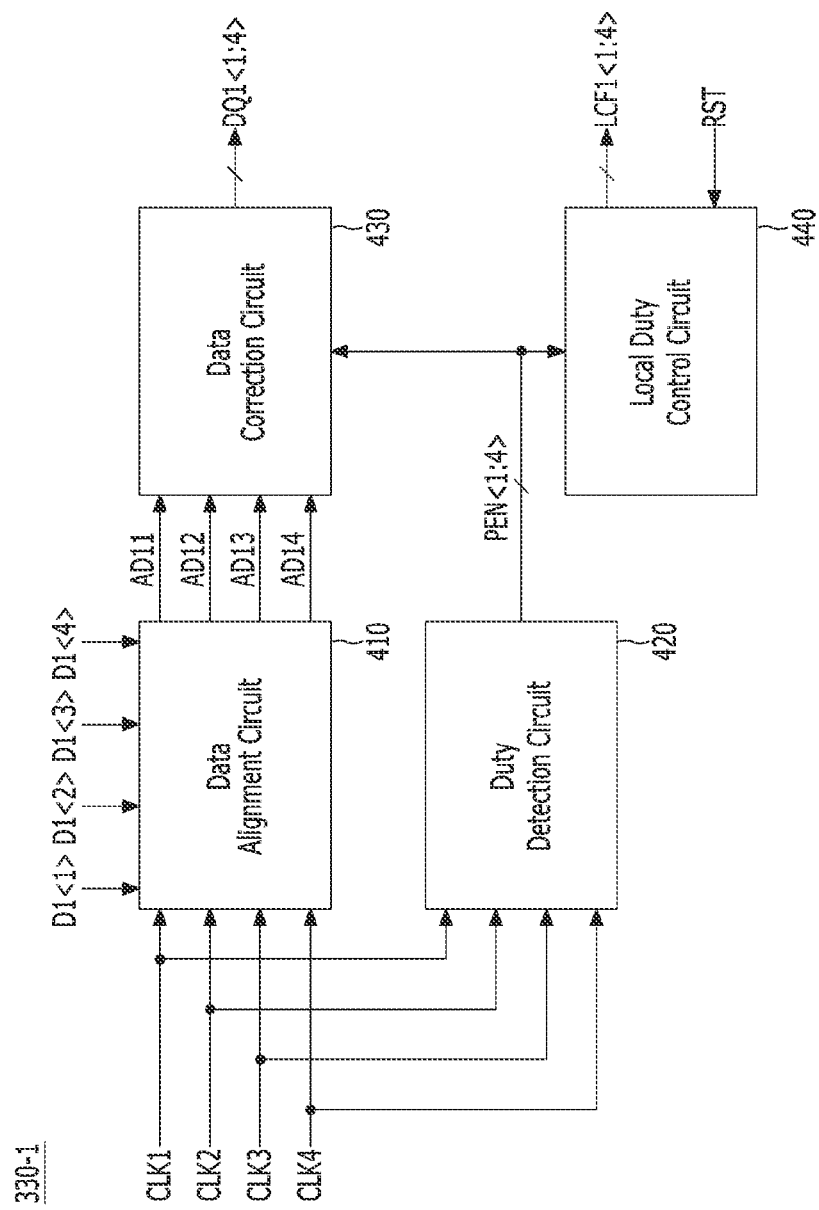
FIG. 4 is a block diagram illustrating a configuration of a first output circuit illustrated in FIG. 3.

FIG. 4 is a block diagram illustrating a configuration of the first output circuit 330-1 illustrated in FIG. 3. Referring to FIG. 4, the first output circuit 330-1 may include a data alignment circuit 410, a duty detection circuit 420, a data correction circuit 430 and a local duty control circuit 440. The duty detection circuit 420, the data correction circuit 430 and the local duty control circuit 440 may be components of the local duty correction circuit 331-1. The second to $n^{th}$ output circuits 330-2 to 330-$n$ may have substantially the same structure as that of the first output circuit 330-1 except for input signals and output signals. The data alignment circuit 410 may receive the first to fourth clock signals CLK1 to CLK4 and the plurality of first data signals D1<1:4>. In order to clarify the description, FIG. 4 exemplifies that the first output circuit 330-1 receives four first data signals D1<1:4>, and generates output data DQ1<1:4>. The data alignment circuit 410 may sequentially synchronize the first data signals D1<1:4> with the first to fourth clock signals CLK1 to CLK4, and sequentially output the plurality of first aligned data signals AD11 to AD14. The data alignment circuit 410 may output the first data signal D1<1> as the first aligned data signal AD11 in synchronization with the first clock signal CLK1. The data alignment circuit 410 may output the first data signal D1<2> as the first aligned data signal AD12 in synchronization with the second clock signal CLK2. The data alignment circuit 410 may output the first data signal D1<3> as the first aligned data signal AD13 in synchronization with the third clock signal CLK3. The data alignment circuit 410 may output the first data signal D1<4> as the first aligned data signal AD14 in synchronization with the fourth clock signal CLK4. For example, the data alignment circuit 410 may be a serializer which sequentially outputs the first data signals D1<1:4>, inputted at the same time, as the first aligned data signals AD11 to AD14. The data alignment circuit 410 may include components of any publicly known serializer.

The duty detection circuit 420 may receive the first to fourth clock signals CLK1 to CLK4. The duty detection circuit 420 may generate a phase correction signal PEN<1:4> by detecting the phases and/or duty ratios of the first to fourth clock signals CLK1 to CLK4. The duty detection circuit 420 may detect whether the first to fourth clock signals CLK1 to CLK4 have a unit phase difference therebetween, and selectively enable the phase correction signal PEN<1:4>. The phase correction signal PEN<1:4> may be a digital signal including a plurality of bits. A first bit PEN<1> of the phase correction signal may be related to the phase and/or duty ratio of the first clock signal CLK1, and a second bit PEN<2> of the phase correction signal may be related to the phase and/or duty ratio of the second clock signal CLK2. A third bit PEN<3> of the phase correction signal may be related to the phase and/or duty ratio of the third clock signal CLK3, and a fourth bit PEN<4> of the phase correction signal may be related to the phase and/or duty ratio of the fourth clock signal CLK4. For example, when the second clock signal CLK2 leads the first, third and fourth clock signals CLK1, CLK3 and CLK4 or a high level interval thereof is longer than a low level interval thereof, the duty detection circuit 420 changes the second bit PEN<2> of the phase correction signal to a high logic level, and retains the first, third and fourth bits PEN<1>, PEN<3> and PEN<4> at a low logic level. The duty detection circuit 420 may generate the phase correction signal PEN<1:4> by periodically detecting the phases and duty ratios of the first to fourth clock signals CLK1 to CLK4. For example, the duty detection circuit 420 may perform a duty detection operation in synchronization with a clock signal having a frequency equal to or lower than those of the first to fourth clock signals CLK1 to CLK4. The duty detection circuit 420 may include components of any publicly known phase detector or duty detector which can detect the phases of four clock signals by comparing the duty ratios of the four clock signals.

The data correction circuit 430 may receive the plurality of first aligned data signals AD11 to AD14 from the data alignment circuit 410, and receive the phase correction signal PEN<1:4> from the duty detection circuit 420. The data correction circuit 430 may generate the output data DQ1<1:4> by variably delaying the plurality of first aligned data signals AD11 to AD14 based on the phase correction signal PEN<1:4>. When the bits of the phase correction signal PEN<1:4> all have a low logic level, the data correction circuit 430 may delay the plurality of first aligned data signals AD11 to AD14 by the same delay time, and sequentially output the delayed signals as the output data DQ1<1:4>. When a specific bit of the bits of the phase correction signal PEN<1:4> has a high logic level, the data correction circuit 430 may increase the delay times of the aligned data signals which are aligned in synchronization with a clock signal related to the bit having the high logic level. For example, when only the second bit PEN<2> of the phase correction signal has a high logic level, the data correction circuit 430 may additionally delay the first aligned data signal AD12, and output the delayed signal as the output data DQ1<2>. When the second clock signal CLK2 leads the other clock signals, the point in time that the first aligned data signal AD12 is generated may be advanced. Therefore, the data correction circuit 430 may additionally delay the first aligned data signal AD12, such that the first aligned data signals AD11 to AD14 are outputted as the output data DQ1<1:4> at even time intervals. The data correction circuit 430 may adjust the timing at which the first aligned data signals AD11 to AD14 are outputted as the output data, and thus compensate for a change in duration of the output data DQ1<1:4> due to duty differences among the first to fourth clock signals CLK1 to CLK4.

The local duty control circuit 440 may receive the phase correction signal PEN<1:4> from the duty detection circuit 420. The local duty control circuit 440 may generate the first local correction signal LCF1<1:4> based on the phase correction signal PEN<1:4>. The local duty control circuit 440 may generate the first local correction signal LCF1<1:4> by independently counting the respective bits of the phase correction signal PEN<1:4>. The local duty control circuit 440 may count the number of times that the first bit PEN<1> of the phase correction signal is generated at a high logic level. When the count reaches the threshold value, the local duty control circuit 440 may change the first bit LCF1<1> of the first local correction signal to a high logic level. The local duty control circuit 440 may count the number of times that the second bit PEN<2> of the phase correction signal is generated at a high logic level. When the count reaches the threshold value, the local duty control circuit 440 may change the second bit LCF1<2> of the first local correction signal to a high logic level. The local duty control circuit 440 may count the number of times that the third bit PEN<3> of the phase correction signal is generated at a high logic level. When the count reaches the threshold value, the local duty control circuit 440 may change the third bit LCF1<3> of the first local correction signal to a high logic level. The local duty control circuit 440 may count the number of times that the fourth bit PEN<4> of the phase correction signal is generated at a high logic level. When the count reaches the threshold value, the local duty control circuit 440 may change the fourth bit LCF1<4> of the first local correction signal to a high logic level. The local duty control circuit 440 may receive the reset signal RST from the global duty correction circuit 321. The local duty control circuit 440 may reset the first local correction signal LCF1<1:4> when the reset signal RST is enabled.

Figure 5:
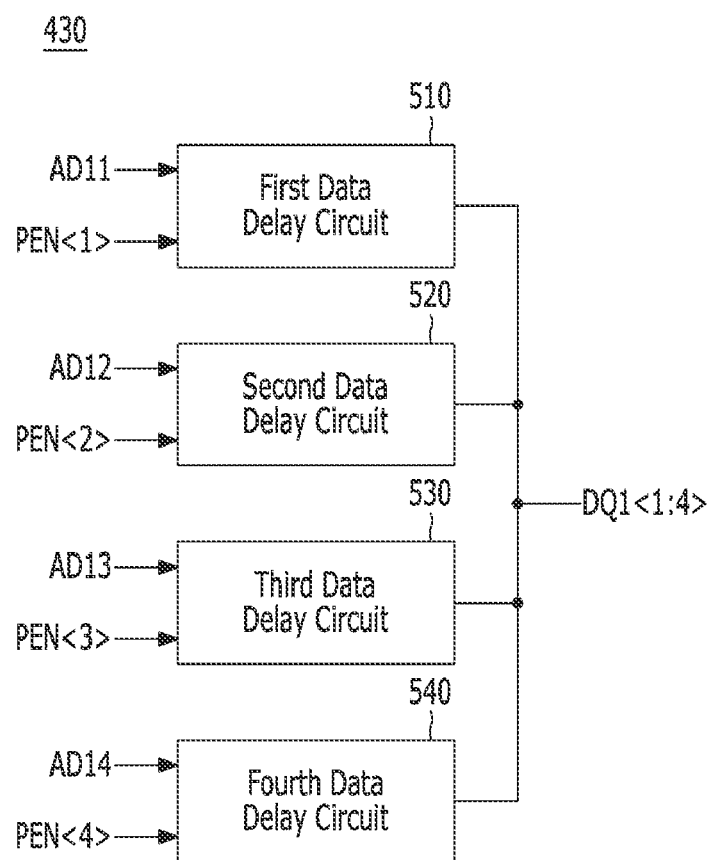
FIG. 5 is a block diagram illustrating a configuration of a data correction circuit illustrated in FIG. 4.

FIG. 5 is a block diagram illustrating a configuration of the data correction circuit 430 illustrated in FIG. 4. The data correction circuit 430 may include a first data delay circuit 510, a second data delay circuit 520, a third data delay circuit 530 and a fourth data delay circuit 540. The first data delay circuit 510 may receive the first aligned data signal AD11 and the first bit PEN<1> of the phase correction signal. The first data delay circuit 510 may variably delay the first aligned data signal AD11 based on the logic level of the first bit PEN<1> of the phase correction signal, and output the delayed data signal as the output data DQ1<1>. The second data delay circuit 520 may receive the first aligned data signal AD11 and the second bit PEN<2> of the phase correction signal. The second data delay circuit 520 may variably delay the first aligned data signal AD12 based on the logic level of the second bit PEN<2> of the phase correction signal, and output the delayed data signal as the output data DQ1<2>. The third data delay circuit 530 may receive the first aligned data signal AD13 and the third bit PEN<3> of the phase correction signal. The third data delay circuit 530 may variably delay the first aligned data signal AD13 based on the logic level of the third bit PEN<3> of the phase correction signal, and output the delayed data signal as the output data DQ1<3>. The fourth data delay circuit 540 may receive the first aligned data signal AD14 and the fourth bit PEN<4> of the phase correction signal. The fourth data delay circuit 540 may variably delay the first aligned data signal AD14 based on the fourth bit PEN<4> of the phase correction signal, and output the delayed data signal as the output data DQ1<4>. When the bits of the phase correction signal PEN<1:4> all have a low logic level, the first to fourth data delay circuits 510, 520, 530 and 540 may delay the first aligned data signals AD11 to AD14 by the same delay time, respectively. When the bits of the phase correction signal PEN<1:4>, corresponding to the first to fourth data delay circuits 510, 520, 530 and 540, all have a low logic level, the first to fourth data delay circuits 510, 520, 530 and 540 may increase the delay times by which the first aligned data signals AD11 to AD14 are delayed. For example, when the second bit PEN<2> of the phase correction signal has a high logic level and the first bit PEN<1>, the third bit PEN<3> and the fourth bit PEN<4> thereof all have a low logic level, the delay time of the second data delay circuit 520 may be increased further than those of the first, third and fourth data delay circuits 510, 530 and 540. The first to fourth data delay circuits 510, 520, 530 and 540 may adjust the output timing of the output data DQ1<1:4> by changing the times, by which the first aligned data signals AD11 to AD14 are delayed, based on the phase correction signal PEN<1:4>.

Figure 6:
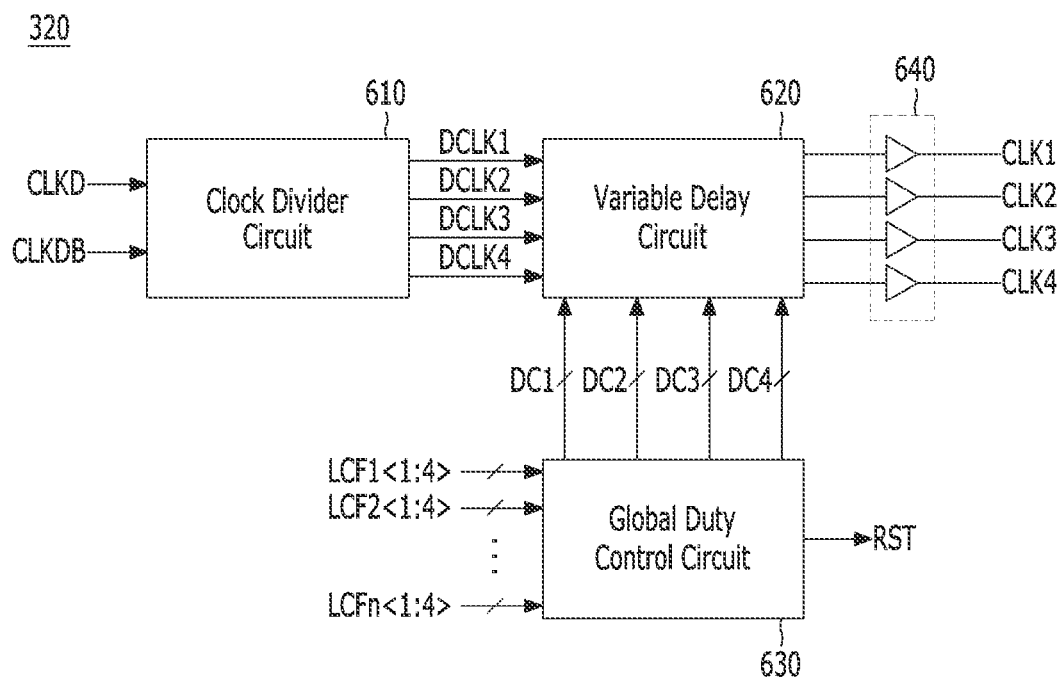
FIG. 6 is a block diagram illustrating a configuration of a clock distribution network illustrated in FIG. 3.

FIG. 6 is a block diagram illustrating a configuration of the clock distribution network 320 illustrated in FIG. 3. Referring to FIG. 6, the clock distribution network 320 may include a clock divider circuit 610, a variable delay circuit 620 and a global duty control circuit 630. The variable delay circuit 620 and the global duty control circuit 630 may be components of the global duty correction circuit 321. The clock divider circuit 610 may receive the delayed clock signal CLKD and the complementary signal CLKDB, which are outputted from the clock generation circuit 310. The clock divider circuit 610 may generate a first divided clock signal DCLK1, a second divided clock signal DCLK2, a third divided clock signal DCLK3 and a fourth divided clock signal DCLK4 by dividing the frequencies of the delayed clock signal CLKD and the complementary signal CLKDB. The first to fourth divided clock signals DCLK1 to DCLK4 may sequentially have a unit phase difference therebetween, and the unit phase difference may correspond to ¼ period of the first to fourth divided to clock signals DCLK1 to DCLK4. The clock divider circuit 610 may generate the first and third divided clock signals DCLK1 and DCLK3 by dividing the frequency of the delayed clock signal CLKD, and generate the second and fourth divided clock signals DCLK2 and DCLK4 by dividing the frequency of the complementary signal CLKDB. The first to fourth divided clock signals DCLK1 to DCLK4 may be clock signals corresponding to the internal clock signals ICLK1 and ICLK2 received by the global duty correction circuit 110 illustrated in FIG. 1.

Figure 7:
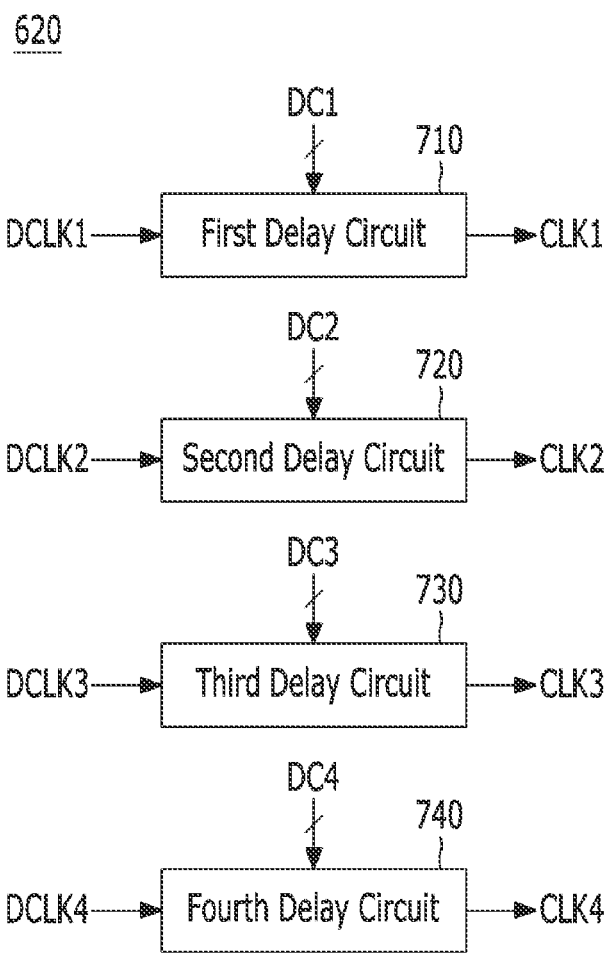
FIG. 7 is a block diagram illustrating a configuration of a variable delay circuit illustrated in FIG. 6.

The variable delay circuit 620 may receive the first to fourth divided clock signals DCLK1 to DCLK4 and first to fourth delay control signals DC1, DC2, DC3 and DC4. The variable delay circuit 620 may variably delay the first to fourth divided clock signals DCLK1 to DCLK4 based on the first to fourth delay control signals DC1 to DC4, and output the first to fourth clock signals CLK1 to CLK4. FIG. 7 is a block diagram illustrating a configuration of the variable delay circuit 620 illustrated in FIG. 6. Referring to FIG. 7, the variable delay circuit 620 may include a first delay circuit 710, a second delay circuit 720, a third delay circuit 730 and a fourth delay circuit 740. The first delay circuit 710 may receive the first divided clock signal DCLK1 and the first delay control signal DC1, and output the first clock signal CLK1. The first delay circuit 710 may adjust the output timing of the first clock signal CLK1 by variably delaying the first divided clock signal DCLK1 based on the first delay control signal DC1. The second delay circuit 720 may receive the second divided clock signal DCLK2 and the second delay control signal DC2, and output the second clock signal CLK2. The second delay circuit 720 may adjust the output timing of the second clock signal CLK2 by variably delaying the second divided clock signal DCLK2 based on the second delay control signal DC2. The third delay circuit 730 may receive the third divided clock signal DCLK3 and the third delay control signal DC3, and output the third clock signal CLK3. The third delay circuit 730 may adjust the output timing of the third clock signal CLK3 by variably delaying the third divided clock signal DCLK3 based on the third delay control signal DC3. The fourth delay circuit 740 may receive the fourth divided clock signal DCLK4 and the fourth delay control signal DC4, and output the fourth clock signal CLK4. The fourth delay circuit 740 may adjust the output timing of the fourth clock signal CLK4 by variably delaying the fourth divided clock signal DCLK4 based on the fourth delay control signal DC4. The delay times of the first to fourth delay circuits 710, 720, 730 and 740 may be changed according to the logic values of the first to fourth delay control signals DC1 to DC4.

Referring back to FIG. 6, the global duty control circuit 630 may receive the first to $n^{th}$ local correction signals LCF1<1:4> to LCFn<1:4> from the first to $n^{th}$ output circuits 330-1 to 330-$n$. The global duty control circuit 630 may generate the first to fourth delay control signals DC1 to DC4, based on the first to $n^{th}$ local correction signals LCF1<1:4> to LCFn<1:4>. The global duty control circuit 630 may change the logic value of the first delay control signal DC1, when the majority of the first bits LCF1<1> to LCFn<1> of the first to $n^{th}$ local correction signals has a high logic level. For example, the global duty control circuit 630 may increase the logic value of the first delay control signal DC1. The global duty control circuit 630 may change the logic value of the second delay control signal DC2, when the majority of the second bits LCF1<2> to LCFn<2> of the first to $n^{th}$ local correction signals has a high logic level. For example, the global duty control circuit 630 may increase the logic value of the second delay control signal DC2. The global duty control circuit 630 may change the logic value of the third delay control signal DC3, when the majority of the third bits LCF1<3> to LCFn<3> of the first to $n^{th}$ local correction signals has a high logic level. For example, the global duty control circuit 630 may increase the logic value of the third delay control signal DC3. The global duty control circuit 630 may change the logic value of the fourth delay control signal DC4, when the majority of the fourth bits LCF1<4> to LCFn<4> of the first to $n^{th}$ local correction signals has a high logic level. For example, the global duty control circuit 630 may increase the logic value of the fourth delay control signal DC4. The global duty control circuit 630 may generate the reset signal RST based on the first to $n^{th}$ local correction signals LCF1<1:4> to LCFn<1:4>, and provide the reset signal RST to the local duty correction circuits 331-1 to 331-$n$.

The clock distribution network 320 may further include a repeater 640. The repeater 640 may drive the first to fourth clock signals CLK1 to CLK4 outputted from the variable delay circuit 620, and transmit the first to fourth clock signals CLK1 to CLK4 to the plurality of output circuits 330-1 to 330-$n$.

Figure 8:
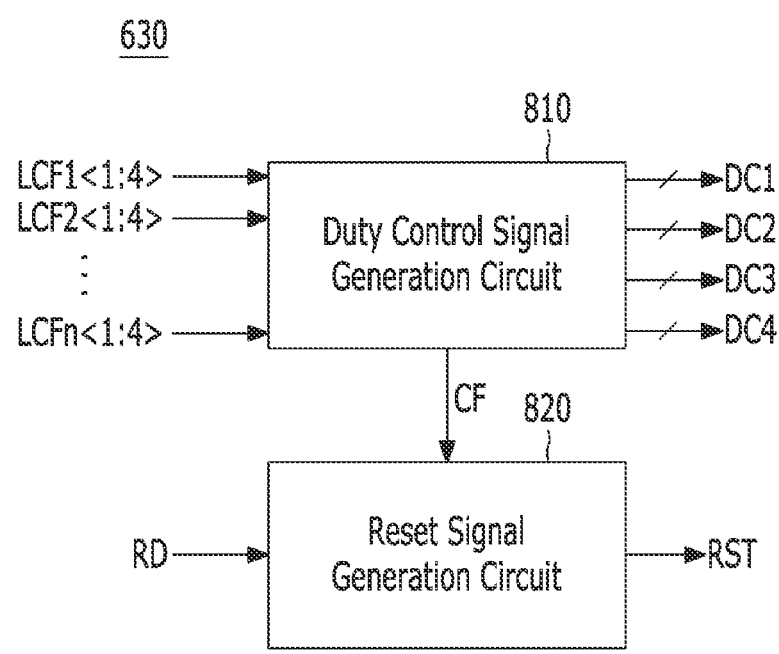
FIG. 8 is a block diagram illustrating a configuration of a global duty control circuit illustrated in FIG. 6.
Figure 9:
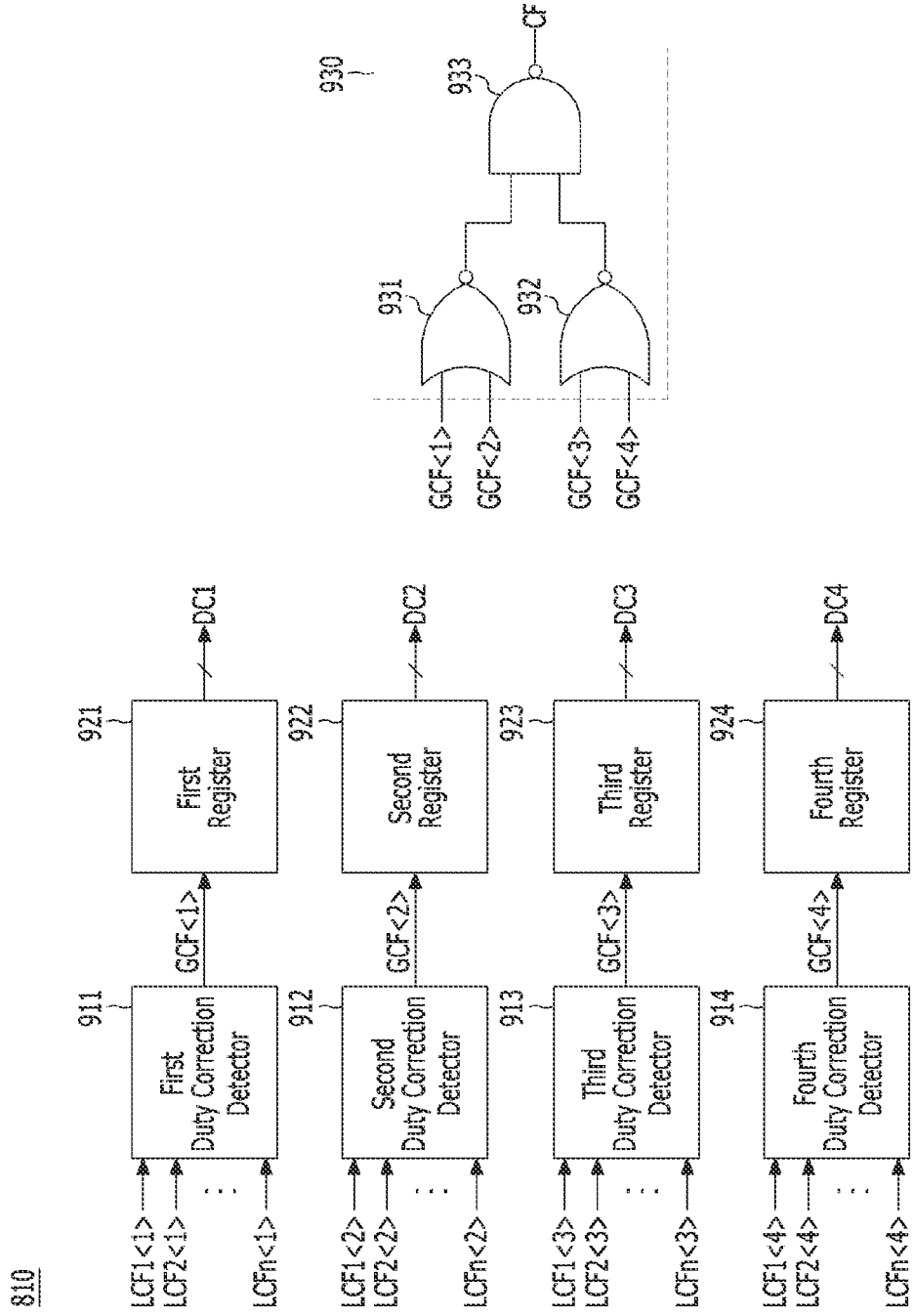
FIG. 9 is a block diagram illustrating a configuration of a duty control signal generation circuit illustrated in FIG. 8.

FIG. 8 is a block diagram illustrating a configuration of the global duty control circuit 630 illustrated in FIG. 6. Referring to FIG. 8, the global duty control circuit 630 may include a duty control signal generation circuit 810 and a reset signal generation circuit 820. The duty control signal generation circuit 810 may receive the first to $n^{th}$ local correction signals LCF1<1:4> to LCFn<1:4>, and generate the first to fourth delay control signals DC1 to DC4. FIG. 9 is a block diagram illustrating a configuration of the duty control signal generation circuit 810 illustrated in FIG. 8. Referring to FIG. 9, the duty control signal generation circuit 810 may include a first duty correction detector 911, a first register 921, a second duty correction detector 912, a second register 922, a third duty correction detector 913, a third register 923, a fourth duty correction detector 914 and a fourth register 924. The first duty correction detector 911 may receive the first bits LCF1<1> to LCFn<1> of the first to $n^{th}$ local correction signals, and generate a first global correction signal GCF<1>. The first duty correction detector 911 may enable the first global correction signal GCF<1> to a high logic level when the majority of the first bits LCF1<1> to LCFn<1> of the first to $n^{th}$ local correction signals has a high logic level. The first register 921 may receive the first global correction signal GCF<1> and generate the first delay control signal DC1. The first register 921 may store the default value of the first delay control signal DC1. When the first global correction signal GCF<1> is enabled, the first register 921 may change the logic value of the first delay control signal DC1, and thus change the delay time of the first delay circuit 710 which receives the first delay control signal DC1.

The second duty correction detector 912 may receive the second bits LCF1<2> to LCFn<2> of the first to $n^{th}$ local correction signals, and generate a second global correction signal GCF<2>. The second duty correction detector 912 may enable the second global correction signal GCF<2> to a high logic level when the majority of the second bits LCF1<2> to LCFn<2> of the first to $n^{th}$ local correction signals has a high logic level. The second register 922 may receive the second global correction signal GCF 2> and generate the second delay control signal DC2. The second register 922 may store the default value of the second delay control signal DC2. The second delay control signal DC2 may have the same default value as that of the first delay control signal DC1. When the second global correction signal GCF<2> is enabled, the second register 922 may change the logic value of the second delay control signal DC2, and thus change the delay time of the second delay circuit 720 which receives the second delay control signal DC2.

The third duty correction detector 913 may receive the third bits LCF1<3> to LCFn<3> of the first to $n^{th}$ local correction signals, and generate a third global correction signal GCF<3>. The third duty correction detector 913 may enable the third global correction signal GCF<3> to a high logic level when the majority of the third bits LCF1<3> to LCFn<3> of the first to $n^{th}$ local correction signals has a high logic level. The third register 923 may receive the third global correction signal GCF<3> and generate the third delay control signal DC3. The third register 923 may store the default value of the third delay control signal DC3. The third delay control signal DC3 may have the same default value as that of the first delay control signal DC1. When the third global correction signal GCF<3> is enabled, the third register 923 may change the logic value of the third delay control signal DC3, and thus change the delay time of the third delay circuit 730 which receives the third delay control signal DC3.

The fourth duty correction detector 914 may receive the fourth bits LCF1<4> to LCFn<4> of the first to n$^{th}$ local correction signals, and generate a fourth global correction signal GCF<4>. The fourth duty correction detector 914 may enable the fourth global correction signal GCF<4> to a high logic level when the majority of the fourth bits LCF1<4> to LCFn<4> of the first to n$^{th}$ local correction signals has a high logic level. The fourth register 924 may receive the fourth global correction signal GCF<4> and generate the fourth delay control signal DC4. The fourth register 924 may store the default value of the fourth delay control signal DC4. The fourth delay control signal DC4 may have the same default value as that of the first delay control signal DC1. When the fourth global correction signal GCF<4> is enabled, the fourth register 924 may change the logic value of the fourth delay control signal DC4, and thus change the delay time of the fourth delay circuit 740 which receives the fourth delay control signal DC4.

The duty control signal generation circuit 810 may further include a correction flag generation circuit 930. The correction flag generation circuit 930 may receive the first to fourth global correction signals GCF<1:4>, and generate a correction flag CF based on the first to fourth global correction signals GCF<1:4>. The correction flag CF may include information on whether the global duty correction operation is performed by the global duty correction circuit 321. The correction flag generation circuit 930 may enable the correction flag CF when any one of the first to fourth global correction signals GCF<1:4> is enabled. The correction flag generation circuit 930 may include a first NOR gate 931, a second NOR gate 932 and a NAND gate 933. The first NOR gate 931 may receive the first global correction signal GCF<1> and the second global correction signal GCF<2>. The second NOR gate 932 may receive the third global correction signal GCF<3> and the fourth global correction signal GCF<4>. The NAND gate 933 may receive outputs of the first and second NOR gates 931 and 932 and output the correction flag CF. When any one of the first to fourth global correction signals GCF<1:4> has a high logic level, the first and second NOR gates 931 and 932 may change an input of the NAND gate 933 to a low logic level, such that the NAND gate 933 generates the correction flag CF at a high logic level.

Referring back to FIG. 8, the reset signal generation circuit 820 may receive the correction flag CF generated through the duty control signal generation circuit 810, and further receive an operation information signal RD. The reset signal generation circuit 820 may generate the reset signal RST based on the correction flag CF and the operation information signal RD. The operation information signal RD may include information on whether the plurality of output circuits 330-1 to 330-$n$ perform an operation. For example, when the plurality of output circuits 330-1 to 330-$n$ perform an operation of outputting the output data DQ1<1:m> to DQn<1:m>, the operation information signal RD may be enabled. For example, when the plurality of output circuits 330-1 to 330-$n$ do not perform the operation of outputting the output data DQ1<1:m> to DQn<1:m>, the operation information signal RD may be disabled. The operations of the plurality of output circuits 330-1 to 330-$n$ to output the output data DQ1<1:m> to DQn<1:m> may be read operations, and the operation information signal RD may be generated based on a read signal indicating the read operations. When the plurality of output circuits 330-1 to 330-$n$ do not perform the operation of outputting the output data DQ1<1:m> to DQn<1:m>, the reset signal generation circuit 820 may generate the reset signal RST according to the correction flag CF. The reset signal generation circuit 820 may enable the reset signal RST when the correction flag CF is enabled while the operation information signal RD is disabled.

Figure 10:
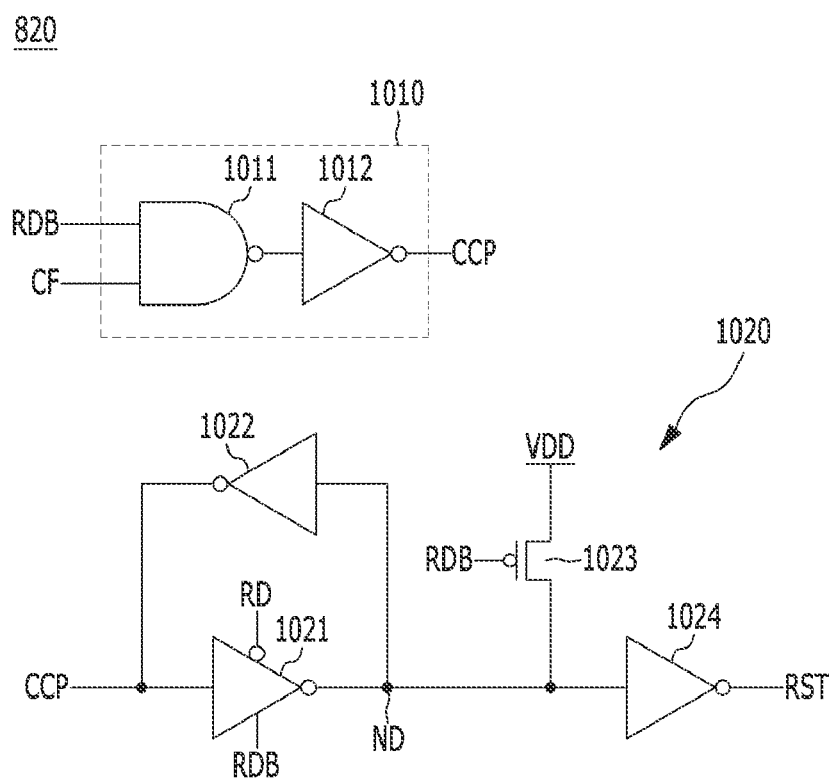
FIG. 10 is a diagram illustrating a configuration of a reset signal generation circuit illustrated in FIG. 8.

FIG. 10 is a diagram illustrating a configuration of the reset signal generation circuit 820 illustrated in FIG. 8. Referring to FIG. 10, the reset signal generation circuit 820 may include a correction completion signal generator 1010 and a reset signal generator 1020. The correction completion signal generator 1010 may receive the operation information signal RD and the correction flag CF, and generate a correction completion signal CCP based on the operation information signal RD and the correction flag CF. The correction completion signal generator 1010 may enable the correction completion signal CCP when the correction flag CF is enabled while the operation information signal RD is disabled. The reset signal generator 1020 may receive the correction completion signal CCP and the operation information signal RD, and generate the reset signal RST based on the correction completion signal CCP and the operation information signal RD. The reset signal generator 1020 may enable the reset signal RST when the correction completion signal CCP is enabled while the operation information signal RD is disabled.

The correction completion signal generator 1010 may include a NAND gate 1011 and an inverter 1012. The NAND gate 1011 may receive an inverted signal RDB of the operation information signal and the correction flag CF. The inverter 1012 may invert an output of the NAND gate 1011, and output the correction completion signal CCP. The correction completion signal generator 1010 may generate the correction completion signal CCP at a high logic level, when the operation information signal RD has a low logic level and the correction flag CF has a high logic level. In an embodiment, the correction flag generation circuit 930 may not be included as a component of the duty control signal generation circuit 810, but be included as a component of the reset signal generation circuit 820.

The reset signal generator 1020 may include a first inverter 1021, a second inverter 1022, a transistor 1023 and a third inverter 1024. The first inverter 1021 may receive the correction completion signal CCP, and change the voltage level of a node ND by inverting the correction completion signal CCP. The first inverter 1021 may be selectively activated based on the operation information signal RD. The first inverter 1021 may invert the correction completion signal CCP when the operation information signal RD is disabled to a low logic level. The second inverter 1022 may receive an output signal of the first inverter 1021, and have an output terminal coupled to an input terminal of the first inverter 1021. The second inverter 1022 may form a latch with the first inverter 1021, and thus retain the voltage level of the node ND. The transistor 1023 may precharge the node ND based on the operation information signal RD. The transistor 1023 may be a P-channel MOS transistor. The transistor 1023 may have a gate configured to receive the inverted signal RDB of the operation information signal, a source configured to receive a supply voltage VDD, and a drain coupled to the node ND. The supply voltage VDD may have a sufficiently high voltage level which may be determined as a high logic level. When the operation information signal RD is enabled to a high logic level, the transistor 1023 may supply the supply voltage VDD to the node ND, in order to precharge the node ND with a high logic level. The third inverter 1024 may have an input terminal coupled to the node ND and an output terminal configured to output the reset signal RST. When the operation information signal RD is enabled, the transistor 1023 may be turned on to retain the node ND at a high logic level. Thus, the third inverter 1024 may disable the reset signal RST to a low logic level regardless of the logic level of the correction completion signal CCP. When the operation information signal RD is disabled, the transistor 1023 may be turned off. When the correction completion signal CCP is enabled to a high logic level, the node ND may have a low logic level, and the third inverter 1024 may enable the reset signal RST to a high logic level.

Referring to FIGS. 3 to 10, the operation of the semiconductor apparatus 300 in accordance with the embodiment will be described as follows. The clock generation circuit 310 may receive the reference clock signal RCLK, and generate the delayed clock signal CLKD and the complementary signal CLKDB by performing a delay locking operation on the reference clock signal RCLK. The clock generation circuit 310 may include a separate duty correction circuit (not illustrated), and the delayed clock signal CLKD and the complementary signal CLKDB may have a phase difference of 180 degrees therebetween, and each may have a duty ratio of 50:50. The clock divider circuit 610 of the clock distribution network 320 may generate the first to fourth divided clock signals DCLK1 to DCLK4 by dividing the frequencies of the delayed clock signal CLKD and the complementary signal CLKDB. The variable delay circuit 620 may receive the first to fourth delay control signals DC1 to DC4 each having the default value, delay the first to fourth divided clock signals DCLK1 to DCLK4 by the same time, and output the first to fourth clock signals CLK1 to CLK4. Through the repeater 640, the first to fourth clock signals CLK1 to CLK4 may be distributed to the first to $n^{th}$ output circuits 330-1 to 330-$n$. Ideally, the first to fourth clock signals CLK1 to CLK4 may maintain a unit phase difference therebetween, and each may have a duty ratio of 50:50. However, the first to fourth clock signals CLK1 to CLK4 may not retain the unit phase difference and the duty ratio of 50:50, due to the process variations and characteristic of the clock divider circuit 610, the variable delay circuit 620, the repeater 640 or the transmission lines through which the first to fourth clock signals CLK1 to CLK4 are transmitted.

The data alignment circuit 410 of the first output circuit 330-1 may output the plurality of first aligned data signals AD11 to AD14 by synchronizing the plurality of first data signals D1<1:4> with the first to fourth clock signals CLK1 to CLK4. The second to $n^{th}$ output circuits 330-2 to 330-$n$ may generate the aligned data signals in synchronization with the first to fourth clock signals CLK1 to CLK4, respectively. The first output circuit 330-1 may perform a local duty correction operation. The duty detection circuit 420 may generate the phase correction signal PEN<1:4> by detecting the phases and/or duty ratios of the first to fourth clock signals CLK1 to CLK4. For example, when it is detected by the duty detection circuit 420 that the second clock signal CLK2 has a relatively fast phase and does not maintain the duty ratio of 50:50, the duty detection circuit 420 may retain the first, third and fourth bits PEN<1>, PEN<3> and PEN<4> of the phase correction signal at a low logic level, and change the second bit PEN<2> to a high logic level. The data correction circuit 430 may retain the delay times of the first aligned data signals AD11, AD13 and AD14 synchronized with the first, third and fourth clock signals CLK1, CLK3 and CLK4, respectively, based on the phase correction signal PEN<1:4>, and increase the delay time of the first aligned data signal AD12 synchronized with the second clock signal CLK2, in order to generate the output data DQ1<1:4>. Therefore, the durations of the first output data DQ1<1:4> generated based on the plurality of first aligned data signals AD11 to AD14 may become equal to each other. The first output circuit 330-1 may variably delay the plurality of first aligned data signals AD11 to AD14 according to the phase detection results of the first to fourth clock signals CLK1 to CLK4, and thus compensate for a change in duration of the first output data DQ1<1:4> according to the phase skews and the duty ratios of the first to fourth clock signals CLK1 to CLK4. The second to $n^{th}$ output circuits may also generate output data by performing local duty correction operations in the same manner as the first output circuit.

The local duty control circuit 440 may generate the first local correction signal LCF1<1:4> based on the phase correction signal PEN<1:4>. The local duty control circuit 440 may count the number of times that each of the bits of the phase correction signal PEN<1:4> is generated at a high logic level. When the number of times that the second bit PEN<2> of the phase information signal is generated at a high logic level reaches the threshold value, the local duty control circuit 440 may change the second bit LCF1<2> of the first local correction signal to a high logic level. When the count reaches the threshold value, it may be determined that the phase and/or duty ratio of the second clock signal CLK2 has not been temporarily varied due to a supply voltage or other environmental factors, but has been varied according to the characteristic of the first output circuit 330-1. The second to $n^{th}$ output circuits 330-2 to 330-$n$ may also generate the second to $n^{th}$ local correction signals LCF2<1:4> to LCFn<1:4> while performing the local duty correction operations.

The global duty correction circuit 321 may receive the first to $n^{th}$ local correction signals LCF1<1:4> to LCFn<1:4>, and perform the global duty correction operation. The global duty control circuit 630 may receive the first to $n^{th}$ local correction signals LCF1<1:4> to LCFn<1:4>. The phase and/or duty ratio of the second clock signal CLK2 may be changed by the characteristics of the clock distribution network 320 or the characteristics of the plurality of output circuits 330-1 to 330-$n$. The global duty control circuit 630 may enable the first to fourth global correction signals GCF<1:4> only when the majority of the bits of the first to $n^{th}$ local correction signals LCF1<1:4> to LCFn<1:4> has a high logic level. For example, when the second bit LCF1<2> of the first local correction signal outputted from the first output circuit 330-1 has a high logic level and the second bits LCF2<2> to LCFn<2> of the second to $n^{th}$ local correction signals outputted from the second to $n^{th}$ output circuits 330-2 to 330-$n$ all have a low logic level, it may be determined that the phase and/or duty ratio of the second clock signal CLK2 have been changed by the characteristic of the first output circuit 330-1 itself rather than by the characteristics of the clock distribution network 320. Therefore, the global duty correction circuit 321 may not perform the global duty correction operation. The reason is that, when the global duty correction circuit 321 changes the phase and/or duty ratio of the second clock signal CLK2, the durations of the first output data DQ1<1:m> outputted from the first output circuit 330-1 are equalized, but the durations of the second to $n^{th}$ output data DQ2<1:m> to DQn<1:m> outputted from the second to $n^{th}$ output circuits 330-2 to 330-$n$ are changed.

When the majority of the second bits LCF1<2> to LCFn<2> of the first to $n^{th}$ local correction signals has a high logic level, the global duty correction circuit 321 may determine that the phase and/or duty ratio of the second clock signal CLK2 has been changed not by the characteristics of the first to $n^{th}$ output circuits 330-1 to 330-n, but by the characteristics of the clock distribution network 320. Therefore, the duty control signal generation circuit 810 may enable the second global correction signal GCF<2>, retain the logic values of the first, third and fourth delay control signals DC1, DC3 and DC4, and increase the logic value of the second delay control signal DC2. The variable delay circuit 620 may adjust the output timing of the second clock signal CLK2 by additionally delaying the second divided clock signal DCLK2. The reset signal generation circuit 820 may enable the reset signal RST when the correction flag CF is enabled according to the second global correction signal GCF<2> and the operation information signal RD is disabled. The local correction circuits 331-1 to 331-n of the first to $n^{th}$ output circuits 330-1 to 330-n may reset the first to $n^{th}$ local correction signals LCF1<1:4> to LCFn<1:4> based on the reset signal RST. Then, when the phase and/or duty ratio of the second clock signal CLK2 is corrected by the global duty correction circuit 321, the output data DQ1<1:m> to DQn<1:m> outputted from the first to $n^{th}$ output circuits 330-1 to 330-n may all have a constant duration. The semiconductor apparatus 300 in accordance with the present embodiment may control the respective output circuits to individually perform the local duty correction operations, thereby compensating for a change in phase and duty ratio of the clock signal according to the characteristics of the output circuits. When changes in phase and duty ratio of the clock signals in the majority of the output circuits are detected, the semiconductor apparatus may allow the global duty correction circuit, which provides the clock signals to the output circuits, to perform the global duty correction operation. Therefore, while allowing the respective output circuits to individually perform the local duty correction operations to compensate for local variations, the semiconductor apparatus may allow the global duty correction circuit to perform the global duty correction operation only in case of need, thereby reducing the number of output circuits for performing the local duty correction operations and increasing the efficiency of the duty correction operations.

While various embodiments have been described above, it will be understood to those skilled in the art that the embodiments described are examples only. Accordingly, the duty correction device and method and the semiconductor apparatus, which are described herein, should not be limited based on the described embodiments.

What is claimed is:

1. A duty correction device comprising:
   a global duty correction circuit configured to perform a global duty correction operation on at least one of a first clock signal and a second clock signal based on a local correction signal; and
   a local duty correction circuit configured to perform a local duty correction operation of detecting phases of the first and second clock signals and generate the local correction signal when a number of times that the local duty correction operation is performed corresponds to a threshold value.

2. The duty correction device according to claim 1, wherein the global duty correction circuit generates a reset signal after performing the global duty correction operation, and the local duty correction circuit resets the local correction signal based on the reset signal.

3. The duty correction device according to claim 1, wherein the local duty correction circuit generates a phase correction signal by detecting the phases of the first and second clock signals, and generates the local correction signal by counting the number of times that the phase correction signal is generated.

4. A duty correction method comprising:
   performing, by a local duty correction circuit, a local duty correction operation of detecting phases of a first clock signal and a second clock signal;
   providing, by the local duty correction circuit, a local correction signal to a global duty correction circuit by counting a number of times that the local duty correction operation is performed; and
   performing, by the global duty correction circuit, a global duty correction operation on at least one of the first and second clock signals based on the local correction signal.

5. The duty correction method according to claim 4, wherein the performing the local duty correction operation comprises:
   generating a phase correction signal by detecting the phases of the first and second clock signals; and
   variably delaying one or more of a first aligned signal and a second aligned signal, which are synchronized with the first and second clock signals, respectively, based on the phase correction signal.

6. The duty correction method according to claim 4, wherein the providing the local correction signal to the global duty correction circuit comprises:
   counting the number of times that the local duty correction operation is performed; and
   enabling the local correction signal when the number of times that the local duty correction operation is performed reaches a threshold value.

7. The duty correction method according to claim 4, wherein the performing the global duty correction operation comprises:
   generating a delay control signal based on the local correction signal; and
   variably delaying at least one of the first and second clock signals based on the delay control signal.

8. The duty correction method according to claim 4, further comprising, after the performing the global duty correction operation:
   generating, by the global duty correction circuit, a reset signal; and
   resetting, by the local duty correction circuit, the local correction signal based on the reset signal.

9. A semiconductor apparatus comprising:
   a clock distribution network configured to generate a first clock signal and a second clock signal based on an internal clock signal, and perform a global duty correction operation on the first and second clock signals based on at least a first local correction signal and a second local correction signal;
   a first output circuit configured to output a first output data based on the first and second clock signals, detect phases of the first and second clock signals to adjust an output timing of the first output data, and generate the first local correction signal by counting a number of times that the output timing of the first output data is adjusted; and
   a second output circuit configured to output a second output data based on the first and second clock signals, detect phased of the first and second clock signals to adjust an output timing of the second output data, and generate the second local correction signal by counting a number of times that the output timing of the second output data is adjusted.

10. The semiconductor apparatus according to claim 9, wherein the clock distribution network comprises:
a clock divider circuit configured to generate a first divided clock signal and a second divided clock signal by dividing the frequency of the internal clock signal; and
a global duty correction circuit configured to generate the first and second clock signals by variably delaying the first and second divided clock signals based on the first and second local correction signals.

11. The semiconductor apparatus according to claim 10, wherein the global duty correction circuit comprises:
a global duty control circuit configured to generate a first delay control signal and a second delay control signal based on the first and second local correction signals; and
a variable delay circuit configured to generate the first clock signal by variably delaying the first divided clock signal based on the first delay control signal, and generate the second clock signal by variably delaying the second divided clock signal based on the second delay control signal.

12. The semiconductor apparatus according to claim 9, wherein the first output circuit comprises:
a data alignment circuit configured to synchronize a plurality of first data signals with the first and second clock signals, and output a plurality of first aligned data signals; and
a local duty correction circuit configured to delay at least one of the plurality of first aligned data signals by detecting the phases of the first and second clock signals to output the first output signal, and generate the first local correction signal by counting the number of times that the at least one of the plurality of first aligned data signals is delayed.

13. The semiconductor apparatus according to claim 9, wherein the second output circuit comprises:
a data alignment circuit configured to synchronize a plurality of second data signals with the first and second clock signals, and output a plurality of second aligned data signals; and
a local duty correction circuit configured to delay at least one of the plurality of second aligned data signals by detecting the phases of the first and second clock signals to output the second output signal, and generate the second local correction signal by counting the number of times that the at least one of the plurality of second aligned data signals is delayed.

* * * * *